US010004159B2

(12) United States Patent
Chiu et al.

(10) Patent No.: US 10,004,159 B2
(45) Date of Patent: Jun. 19, 2018

(54) WATER-COOLING RADIATOR UNIT AND DEVICE THEREOF

(71) Applicant: ASIA VITAL COMPONENTS CO., LTD., New Taipei (TW)

(72) Inventors: Jung-Yi Chiu, New Taipei (TW); Fu-Kuei Chang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 87 days.

(21) Appl. No.: 15/275,497

(22) Filed: Sep. 26, 2016

(65) Prior Publication Data

US 2018/0092247 A1    Mar. 29, 2018

(51) Int. Cl.
| | | |
|---|---|---|
| *F28D 15/00* | (2006.01) | |
| *H05K 7/20* | (2006.01) | |
| *F28F 3/08* | (2006.01) | |
| *F28F 9/02* | (2006.01) | |
| *F28F 3/04* | (2006.01) | |

(52) U.S. Cl.
CPC ........... *H05K 7/20263* (2013.01); *F28F 3/04* (2013.01); *F28F 3/086* (2013.01); *F28F 9/0221* (2013.01); *H05K 7/20272* (2013.01); *F28F 2250/08* (2013.01); *F28F 2250/102* (2013.01)

(58) Field of Classification Search
CPC ........... H05K 7/20263; H05K 7/20154; H05K 7/20272; F28F 1/24; F28F 13/06; F28F 2250/08; F28F 2250/102; F28F 2250/3083; F28F 3/08; F28F 3/02; F28F 3/04; F28F 3/086; F28F 9/0221; F28D 2021/0028; F28D 2021/0029; F28D 9/0081; F28D 9/0062; F28D 9/0037; F28D 9/0031; F28D 9/0025; F28D 9/0006; F28D 1/0308; F28D 7/04; F28D 1/0472; H01L 23/40; H01L 23/46; H01L 23/473; H01L 23/4735
USPC ....... 165/104.31, 80.4, 166, 244, 80.1, 80.2, 165/DIG. 159, DIG. 185, DIG. 186
See application file for complete search history.

(56) References Cited

U.S. PATENT DOCUMENTS

| | | | | |
|---|---|---|---|---|
| 1,916,768 | A * | 7/1933 | Melcher | ................. F28F 3/083 165/167 |
| 3,631,923 | A * | 1/1972 | Izeki | ........................ F28B 1/02 165/167 |
| 5,186,238 | A * | 2/1993 | del Puerto | ........ H01L 21/67109 165/80.4 |
| 5,343,936 | A * | 9/1994 | Beatenbough | ........ F28D 9/0012 165/167 |

(Continued)

*Primary Examiner* — Justin Jonaitis
(74) *Attorney, Agent, or Firm* — Jackson IPG PLLC; Demian K. Jackson

(57) ABSTRACT

A water-cooling radiator unit and a device thereof. The water-cooling radiator unit includes a main body, a working fluid, a first plate body, a second plate body and a pump. The main body is composed of a first sheet body, a second sheet body and a third sheet body stacked on and assembled with each other to form a flow way set, a conversion sink, a first sink and a second sink. The conversion sink and a partitioning section together divide the main body into a first portion and a second portion. A first flow guide passage and a second flow guide passage are formed on outer side of the conversion sink. The wall faces of the first flow guide passage and the conversion sink of the second portion and the second flow guide passage are respectively formed with multiple first, second and third orifices.

12 Claims, 10 Drawing Sheets

(56) References Cited

U.S. PATENT DOCUMENTS

| | | | | |
|---|---|---|---|---|
| 6,575,231 B1* | 6/2003 | Wu | ............... | H01L 23/467 |
| | | | | 165/121 |
| 7,331,376 B2* | 2/2008 | Gagnon | ............... | F24F 12/006 |
| | | | | 165/54 |
| 2002/0023737 A1* | 2/2002 | Hao | ............... | F28F 3/02 |
| | | | | 165/121 |
| 2002/0144809 A1* | 10/2002 | Siu | ............... | B21D 53/04 |
| | | | | 165/185 |
| 2002/0195231 A1* | 12/2002 | Siu | ............... | B21D 53/04 |
| | | | | 165/104.33 |
| 2003/0164231 A1* | 9/2003 | Goodson | ............... | F04B 19/006 |
| | | | | 165/104.11 |
| 2006/0231238 A1* | 10/2006 | Ball, Jr. | ............... | F28D 1/0325 |
| | | | | 165/104.33 |

\* cited by examiner

WATER-COOLING RADIATOR UNIT AND DEVICE THEREOF

BACKGROUND OF THE INVENTION

1. Field of the Invention

The present invention relates generally to a water-cooling radiator unit and a device thereof, and more particularly to a water-cooling radiator unit and a water-cooling radiator device including the water-cooling radiator unit. The water-cooling radiator unit can reduce thermal impedance and greatly enhance heat exchange efficiency.

2. Description of the Related Art

Heat dissipation devices are widely applied to modern scientific/technologic products, especially in the fields of computer, information and communication. A scientific/technologic product includes therein many sophisticated electronic components so that it is very important to keep these electronic components stably operating. Therefore, it is especially critical to provide heat dissipation effect for these electronic components.

In general, the conventional heat dissipation device is mounted on various electronic components to dissipate the heat generated thereby. A fan device is disposed on the heat dissipation device to blow away the heat inside the heat dissipation device so as to achieve heat dissipation effect. Generally, an electronic device of higher level will employ a water-cooling radiator device to dissipate the heat. The working principle of the water-cooling radiator device is such that a working fluid is driven by a pump and forcedly circulated to carry away the heat generated by the electronic device. In comparison with an air-cooling device, the water-cooling radiator device has the advantages of quietness, stable temperature lowering and less dependence on the environment.

To speak more specifically, as shown in FIG. 8, the conventional water-cooling radiator device 1 includes multiple winding radiating fins 10, multiple flat tubes 11, which are arranged at intervals and two lateral water tanks 12. The radiating fins 10 are disposed between the flat tubes 11 in a winding form. The outer side of the bending point of the radiating fin 10 is soldered with the outer side of the adjacent flat tube 11. Therefore, the radiating fin 10 simply point-to-point, (not face-to-face) contacts the flat tube 11. The two lateral water tanks 12 are also connected with two sides of the soldered radiating fins 10 and flat tubes 11 by means of soldering to form the water-cooling radiator device 1. The water-cooling radiator device 1 has a water inlet 13 and a water outlet 14 respectively connected with two water conduits (not shown). The respectively parts of the aforesaid radiating fins 10, water flow flat tubes 11 and water tanks 12 must be sealedly connected with each other by means of soldering. The soldering is a sort of manufacturing art and technique that employs heating process to connect metal material or other thermoplastic material such as plastic material. However, during the soldering process, when heating the added molten filling material, it often takes place that the molten filling material flows out to partially block the fluid outlet and inlet. Also, it often takes place that the parts are not truly sealed. As a result, when the fluid is circulated, the fluid will partially spill out. Moreover, when the molten filling material is hardened, the residual material often causes a poor appearance of the water-cooling radiator device 1.

Furthermore, in the conventional water-cooling radiator device 1, the heat of the working fluid in the flat tubes 11 will be transferred to the radiating fins 10 to be dissipated. However, there is another derived problem. That is, the heat of the working fluid is transferred to the radiating fins 10 at very low heat conduction efficiency. This is because the radiating fin 10 and the flat tube 11 are two independent components, which are soldered with each other. Therefore, the radiating fin 10 is not a part of the flat tube 11. As a result, when the flat tubes 11 conducts the heat to the radiating fins 10, there is thermal impedance so that after the flat tubes 11 absorbs the heat of the coolant, the flat tubes 11 can hardly conduct the heat to the radiating fins 10 on two sides at high heat conduction efficiency. Consequently, the heat dissipation performance (or the heat exchange efficiency) of the entire water-cooling radiator device 1 is deteriorated. In addition, the outer side of the bending point of the radiating fin 10 is soldered with the outer side of the flat tubes 11 on two sides. Therefore, the structural strength of the middle section of the radiating fin 10 is relatively weak. As a result, in case of collision of external force, the radiating fin 10 is apt to damage (such as deform). Moreover, the heat conduction effect between the flat tube 11 and the radiating fins 10 is quite unideal.

Furthermore, the conventional water-cooling radiator device 1 needs to be soldered so that the manufacturing and assembling process of the conventional water-cooling radiator device 1 is very complicated. As a result, it is time-consuming and laborious to manufacture the conventional water-cooling radiator device 1 and the manufacturing cost of the conventional water-cooling radiator device 1 is quite high. In addition, the conventional water-cooling radiator device 1 has the latent problem of leakage.

SUMMARY OF THE INVENTION

It is therefore a primary object of the present invention to provide a water-cooling radiator unit, which can improve the problem of thermal impedance of the conventional heat dissipation device.

It is a further object of the present invention to provide the above water-cooling radiator unit, which has the characteristic of diversified and flexible design.

It is still a further object of the present invention to provide the above water-cooling radiator unit, which can greatly enhance the heat exchange efficiency.

To achieve the above and other objects, the water-cooling radiator unit of the present invention includes a main body, a working fluid, a first plate body, a second plate body and a pump. The main body is composed of a first sheet body, a second sheet body and a third sheet body stacked on and assembled with each other. Each of the first, second and third sheet bodies is composed of multiple thin sheets laminated with each other. Each of the first, second and third sheet bodies has multiple first strip-shaped flow guide sections, multiple second strip-shaped flow guide sections and a circular conversion section. The first strip-shaped flow guide sections longitudinally extend and are arranged about the circular conversion section. The second strip-shaped flow guide sections transversely extend and are disposed on two sides of the circular conversion section. Two ends of each of the first, second and third sheet bodies respectively have a first slot and a second slot. The aforesaid structures of the first, second and third sheet bodies are correspondingly stacked on and assembled with each other to form a flow way set, a conversion sink, a first sink and a second sink. The flow way set has multiple first flow ways and multiple second flow ways arranged at intervals. Each first flow way and each second flow way define therebetween a radiating fin section. The second strip-shaped flow guide sections together define a partitioning section. The partitioning section and the conversion sink together divide the main body into a first portion and a second portion. A first bight flow guide section is formed on outer side of the circular conversion section of each of the first and second sheet bodies. The first bight flow guide sections are correspondingly stacked on and assembled with each other to form a first flow guide passage. The first flow guide passage, the first flow ways and the first sink are disposed on the first portion in communication with each other. A second bight flow guide section is formed on outer side of the circular conversion section of each of the first, second and third sheet bodies. The second bight flow guide sections are correspondingly stacked on and assembled with each other to form a second flow guide passage. The second flow guide passage, the second flow ways and the second sink are disposed on the second portion in communication with each other. The second sheet body is formed with a circular diaphragm at the circular conversion section. The diaphragm has a perforation. The diaphragm and the third sheet body together define a water receiving chamber. A wall face of the first flow guide passage is formed with multiple first orifices in communication with the first flow ways. A wall face of the conversion sink of the second portion is formed with multiple second orifices in communication with the second flow guide passage. A wall face of the second flow guide passage is formed with multiple third orifices in communication with the second flow ways. The working fluid is filled in the main body. The first and second plate bodies are respectively attached to two faces of the main body. The pump is inserted on the first plate body and received in the conversion sink. The pump has multiple blades. The pump serves to drive the working fluid to circulate within the main body.

To achieve the above and other objects, the water-cooling radiator device of the present invention includes a water-cooling radiator unit, a water-cooling component, a first tube body and a second tube body. The water-cooling radiator unit includes a main body, a working fluid, a first plate body, a second plate body and a pump. The main body is composed of a first sheet body, a second sheet body and a third sheet body stacked on and assembled with each other. Each of the first, second and third sheet bodies is composed of multiple thin sheets laminated with each other. Each of the first, second and third sheet bodies has multiple first strip-shaped flow guide sections, multiple second strip-shaped flow guide sections and a circular conversion section. The first strip-shaped flow guide sections longitudinally extend and are arranged about the circular conversion section. The second strip-shaped flow guide sections transversely extend and are disposed on two sides of the circular conversion section. Two ends of each of the first, second and third sheet bodies respectively have a first slot and a second slot. The aforesaid structures of the first, second and third sheet bodies are correspondingly stacked on and assembled with each other to form a flow way set, a conversion sink, a first sink and a second sink. The flow way set has multiple first flow ways and multiple second flow ways arranged at intervals. Each first flow way and each second flow way define therebetween a radiating fin section. The second strip-shaped flow guide sections together define a partitioning section. The partitioning section and the conversion sink together divide the main body into a first portion and a second portion. A first bight flow guide section is formed on outer side of the circular conversion section of each of the first and second sheet bodies. The first bight flow guide sections are correspondingly stacked on and assembled with each other to form a first flow guide passage. The first flow guide passage, the first flow ways and the first sink are disposed on the first portion in communication with each other. A second bight flow guide section is formed on outer side of the circular conversion section of each of the first, second and third sheet bodies. The second bight flow guide sections are correspondingly stacked on and assembled with each other to form a second flow guide passage. The second flow guide passage, the second flow ways and the second sink are disposed on the second portion in communication with each other. The second sheet body is formed with a circular diaphragm at the circular conversion section. The diaphragm has a perforation. The diaphragm and the third sheet body together define a water receiving chamber. A wall face of the first flow guide passage is formed with multiple first orifices in communication with the first flow ways. A wall face of the conversion sink of the second portion is formed with multiple second orifices in communication with the second flow guide passage. A wall face of the second flow guide passage is formed with multiple third orifices in communication with the second flow ways. The working fluid is filled in the main body. The first and second plate bodies are respectively attached to two faces of the main body. The pump is inserted on the first plate body and received in the conversion sink. The pump has multiple blades. The pump serves to drive the working fluid to circulate within the main body. The water-cooling component has a case. The case has at least one water receptacle, a heat exchange interface, a water inlet and a water outlet. The heat exchange interface is disposed on one side of the case. The water inlet and water outlet communicate with the water receptacle. The first tube body has a first end and a second end. The first end is connected to the water inlet of the water-cooling component. The second end is connected to the second sink. The second tube body has a third end and a fourth end. The third end is connected to the water outlet of the water-cooling component. The fourth end is connected to the first sink.

According to the structural design of the present invention, the main body is composed of the first sheet body, second sheet body and third sheet body stacked on and assembled with each other. Each of the first, second and third sheet bodies is composed of multiple thin sheets laminated with each other. After stacked, the respective structures are formed. In contrast, the radiating fins and the water flow passages and the relevant components of the conventional heat dissipation device must be connected by means of soldering to form the heat dissipation device. This will lead to the problem of thermal impedance. The water-cooling radiator device of the present invention eliminates this shortcoming of the conventional heat dissipation device and greatly enhances the heat exchange efficiency. In addition, it is time-consuming to manufacture the conventional heat dissipation device and the manufacturing cost of the conventional heat dissipation device is very high. The water-cooling radiator device of the present invention shortens the manufacturing time and lowers the manufacturing cost to eliminate the above shortcomings of the conventional heat dissipation device. In addition, the present invention has the characteristic of diversified and flexible design.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
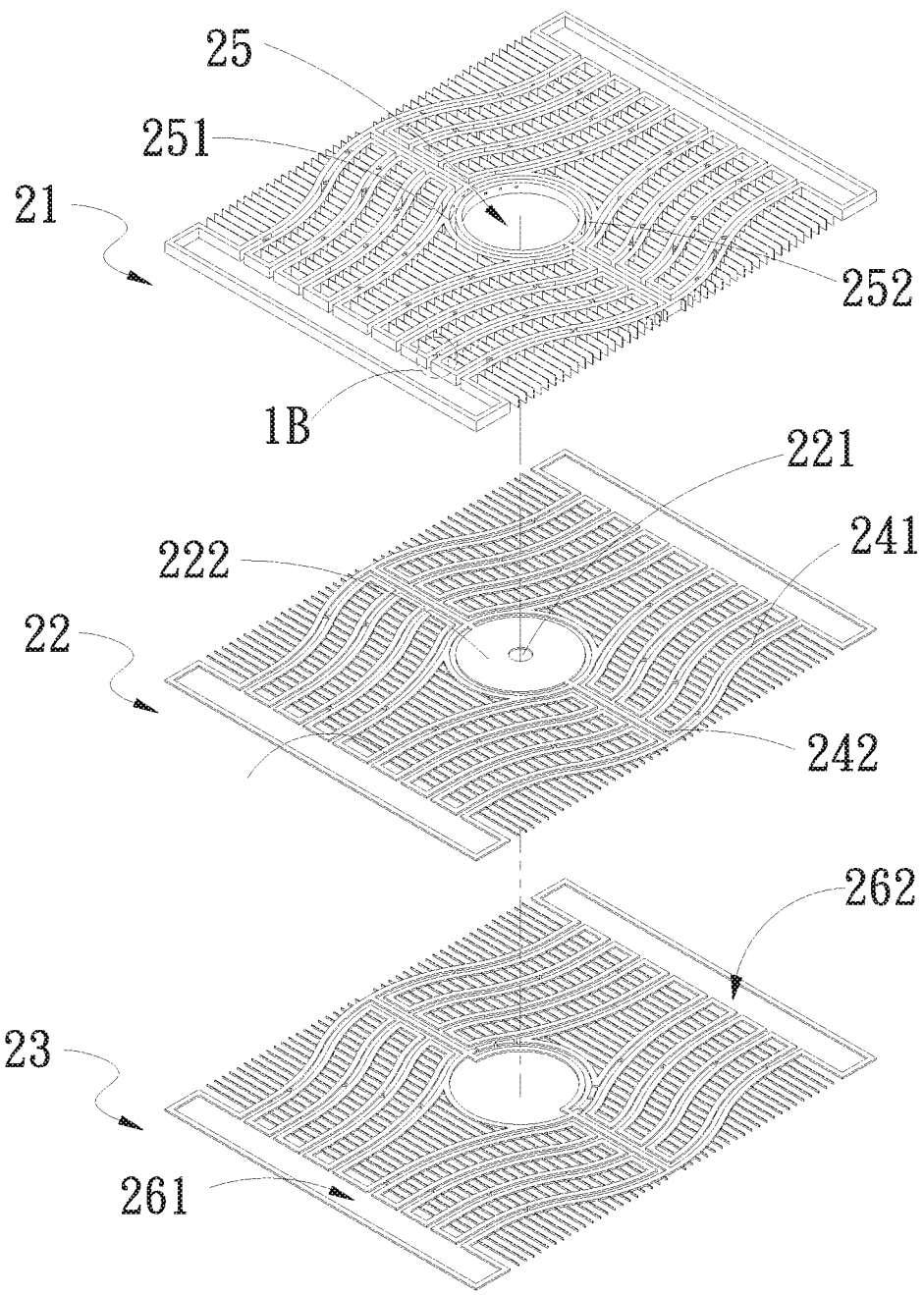
FIG. 1 is a perspective view of a first embodiment of the water-cooling radiator unit of the present invention.
Figure 2A:
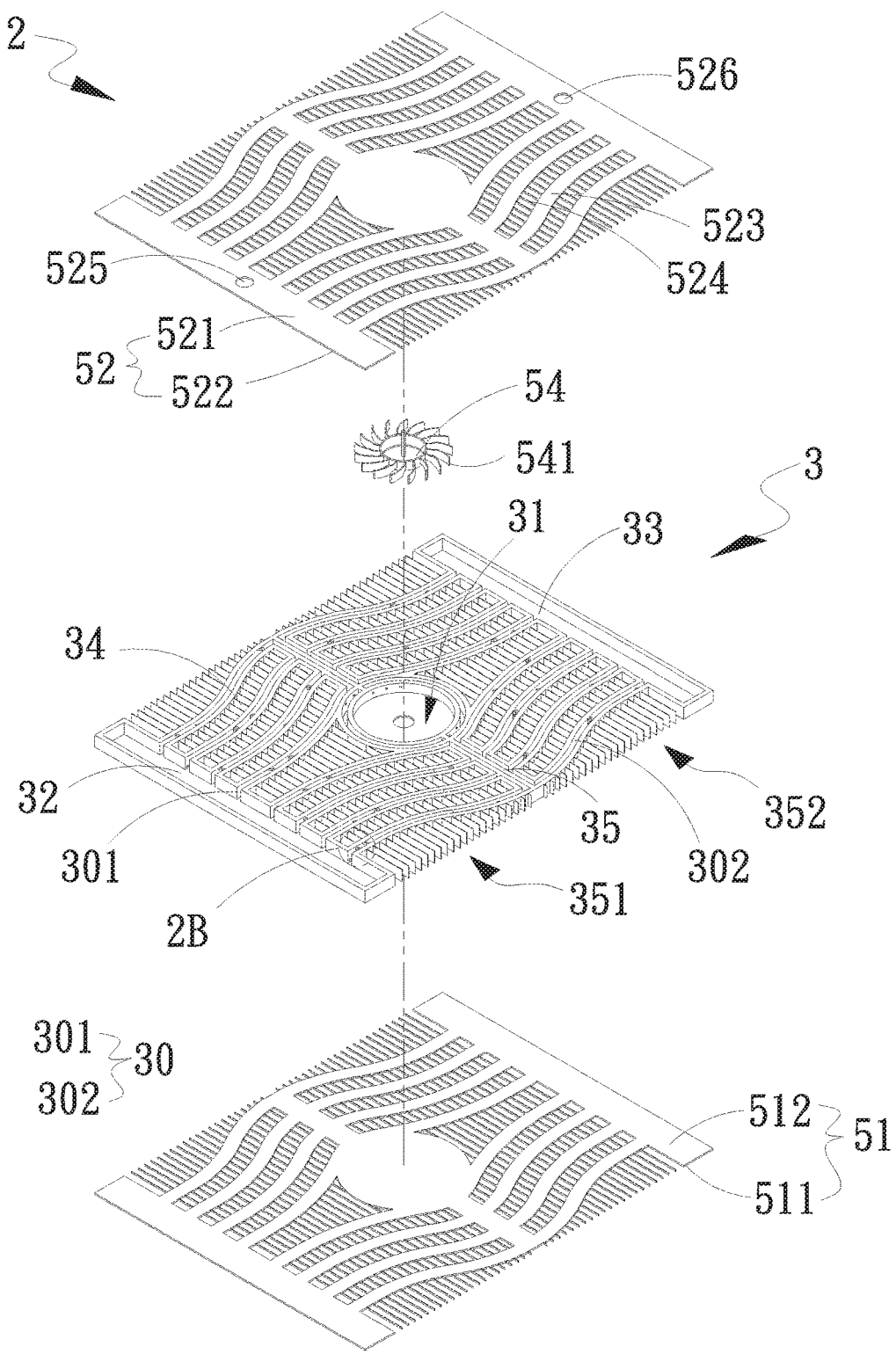
FIG. 2A is a perspective exploded view of the first embodiment of the water-cooling radiator unit of the present invention.
Figure 2B:
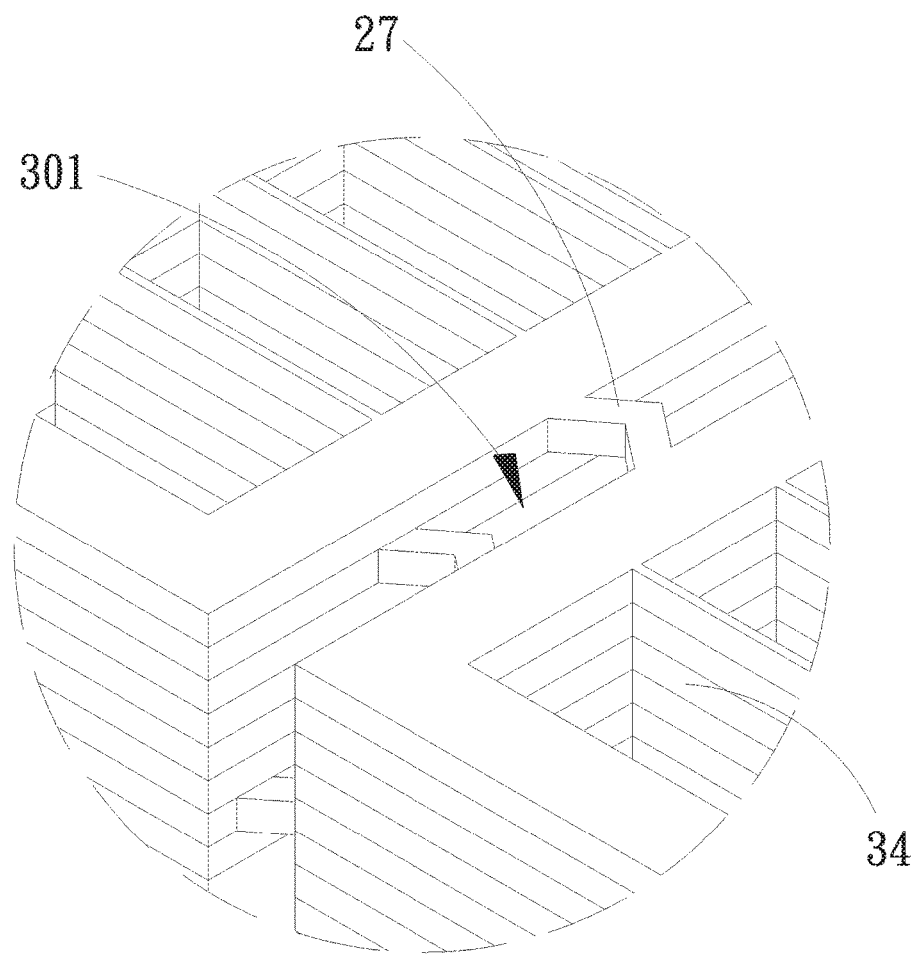
FIG. 2B is an enlarged view of circled area of FIG. 2A.
Figure 3:
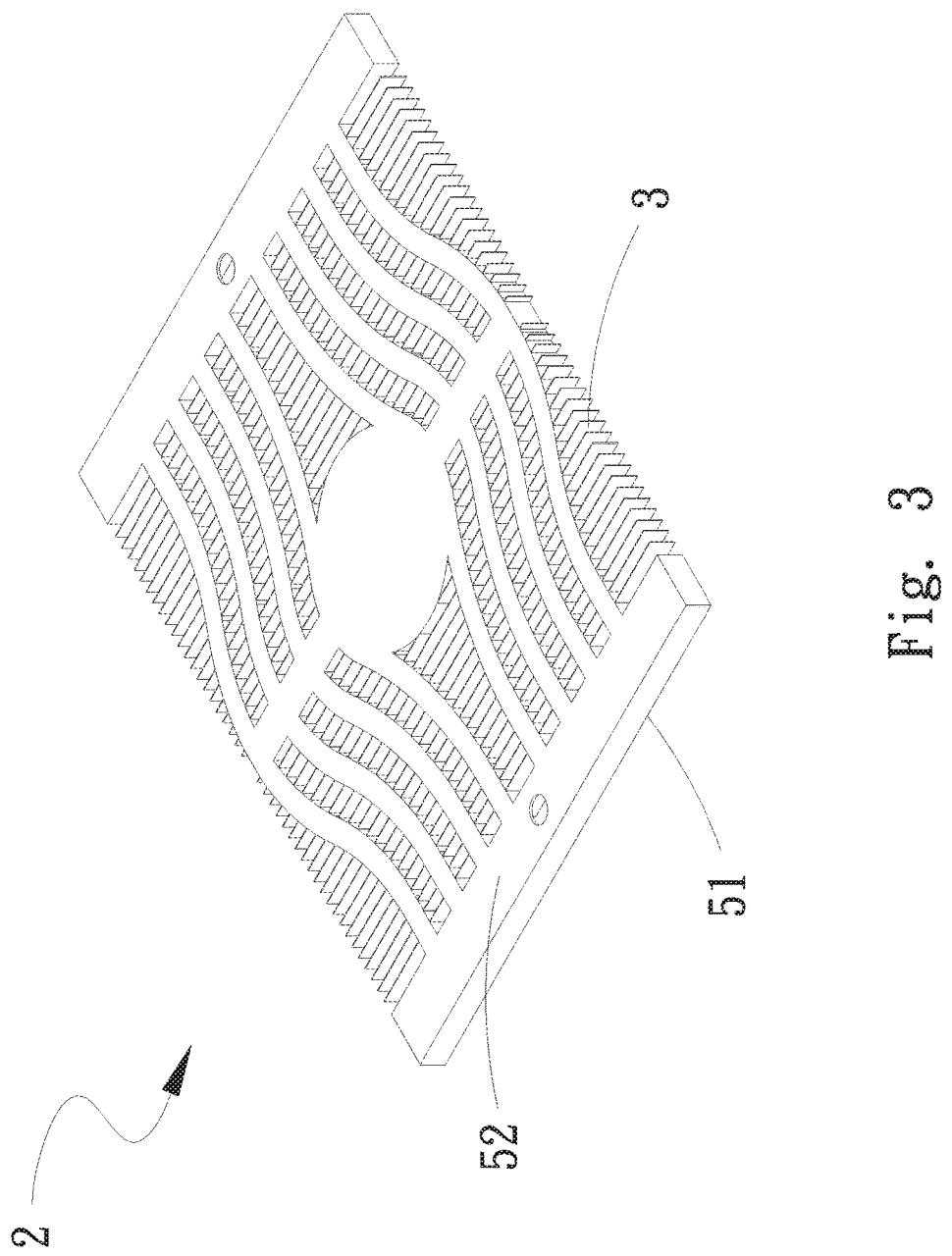
FIG. 3 is a perspective assembled view of the first embodiment of the water-cooling radiator unit of the present invention.
Figure 4A:
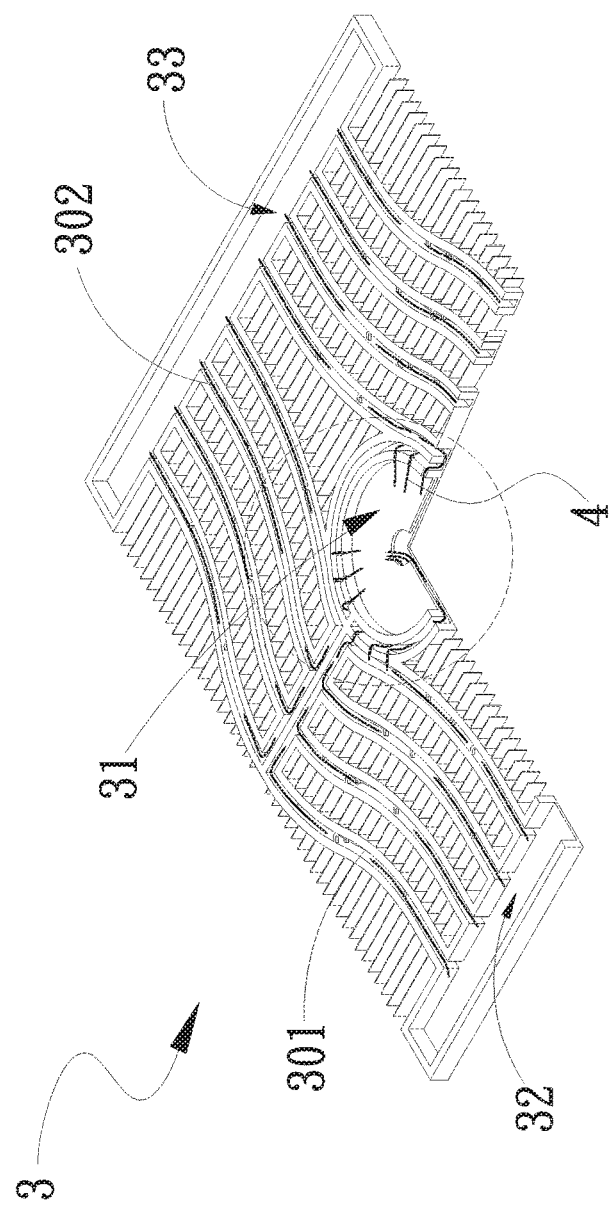
FIG. 4A is a perspective sectional view of the first embodiment of the water-cooling radiator unit of the present invention.
Figure 4B:
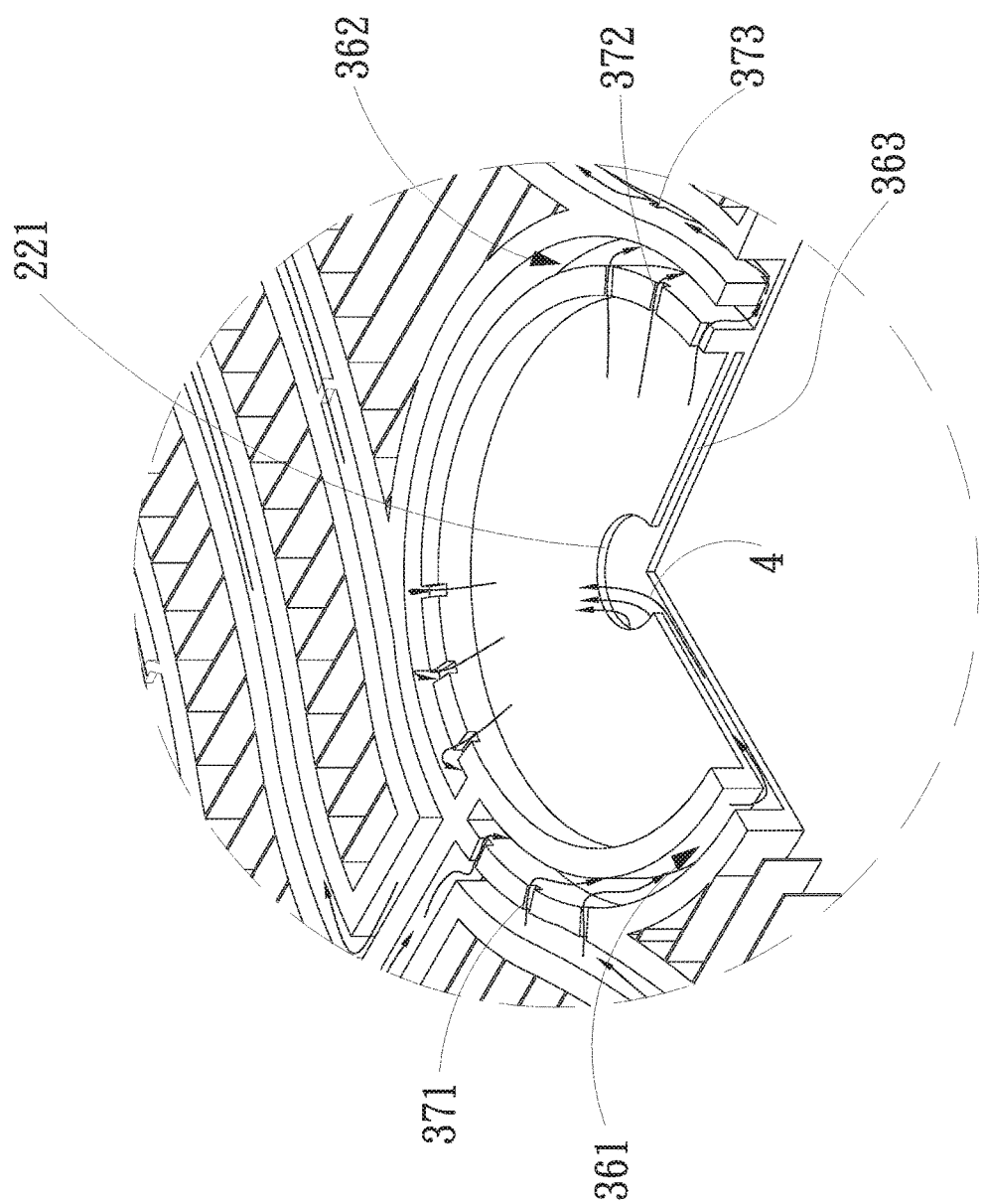
FIG. 4B is an enlarged view of circled area of FIG. 4A.

Please refer to FIGS. 1, 2A, 2B, 3, 4A and 4B. FIG. 1 is a perspective view of a first embodiment of the water-cooling radiator unit of the present invention. FIG. 2A is a perspective exploded view of the first embodiment of the water-cooling radiator unit of the present invention. FIG. 2B is an enlarged view of a part of the first embodiment of the water-cooling radiator unit of the present invention. FIG. 3 is a perspective assembled view of the first embodiment of the water-cooling radiator unit of the present invention. FIG. 4A is a perspective sectional view of the first embodiment of the water-cooling radiator unit of the present invention. FIG. 4B is an enlarged view of circled area of FIG. 4A. According to the first embodiment, the water-cooling radiator unit 2 of the present invention includes a main body 3, a working fluid 4, a first plate body 51, a second plate body 52 and a pump 54. The main body 3 is composed of a first sheet body 21, a second sheet body 22 and a third sheet body 23 stacked on and assembled with each other. Each of the first, second and third sheet bodies 21, 22, 23 is composed of multiple thin sheets laminated with each other. In other words, each of the first, second and third sheet bodies 21, 22, 23 is composed of more than two thin sheets laminated with each other. The first, second and third sheet bodies 21, 22, 23 are further assembled with each other to form the main body 3. The first, second and third sheet bodies 21, 22, 23 are made of a material selected from a group consisting of aluminum, copper, iron, titanium and stainless steel or any other suitable metal material. Each of the first, second and third sheet bodies 21, 22, 23 has multiple first strip-shaped flow guide sections 241, multiple second strip-shaped flow guide sections 242 and a circular conversion section 25. The first strip-shaped flow guide sections 241 longitudinally extend and are arranged about the circular conversion section 25. The second strip-shaped flow guide sections 242 transversely extend and are disposed on two opposite sides of the circular conversion section 25. Two ends of each of the first, second and third sheet bodies 21, 22, 23 respectively have a first slot 261 and a second slot 262. The aforesaid structures of the first, second and third sheet bodies 21, 22, 23 are correspondingly stacked on and assembled with each other to form a flow way set 30, a conversion sink 31, a first sink 32 and a second sink 33. The flow way set 30 has multiple first flow ways 301 and multiple second flow ways 302 arranged at intervals. Each first flow way 301 and each second flow way 302 define therebetween a radiating fin section 34. The second strip-shaped flow guide sections 242 together define a partitioning section 35. The partitioning section 35 and the conversion sink 31 together divide the main body 3 into two portions, that is, a first portion 351 and a second portion 352. A first bight flow guide section 251 is formed on outer side of the circular conversion section 25 of each of the first and second sheet bodies 21, 22. The first bight flow guide sections 251 are correspondingly stacked on and assembled with each other to form a first flow guide passage 361. The first flow guide passage 361, the first flow ways 301 and the first sink 32 are disposed on the first portion 351 in communication with each other. A second bight flow guide section 252 is formed on outer side of the circular conversion section 25 of each of the first, second and third sheet bodies 21, 22, 23. The second bight flow guide sections 252 are correspondingly stacked on and assembled with each other to form a second flow guide passage 362. The second flow guide passage 362, the second flow ways 302 and the second sink 33 are disposed on the second portion 352 in communication with each other. The second sheet body 22 is formed with a circular diaphragm 222 at the circular conversion section 25. The diaphragm 222 has a perforation 221. The diaphragm 222 and the third sheet body 23 together define a water receiving chamber 363. The working fluid 4 is filled in the main body 3.

The first, second and third sheet bodies 21, 22, 23 further has multiple connection sections 27 (as shown in FIG. 2B). The connection sections 27 are transversely bridged over the first and second flow ways 301, 302 and alternately arranged on the first, second and third sheet bodies 21, 22, 23. Two ends of the connection sections 27 are connected with the radiating fin sections 34. In this embodiment, the connection sections 27 are, but not limited to, arrowhead-shaped structures. In practice, the configuration of the connection sections 27 can be designed according to the requirement of a user. For example, the connection sections 27 can be alternatively strip-shaped or curved or in any other geometric form.

In addition, the first and second flow ways 301, 302 can be straight or curved. In other words, the first flow ways 301 are gradually inward curved from the conversion sink 31 to the first sink 32. The second flow ways 302 are gradually inward curved from the conversion sink 31 to the second sink 33. In a modified embodiment, the first flow ways 301 are gradually outward curved from the conversion sink 31 to the first sink 32. The second flow ways 302 are gradually outward curved from the conversion sink 31 to the second sink 33. That is, the configurations of the first and second flow ways 301, 302 can be designed and modified according to the requirement of a user.

The wall face of the first flow guide passage 361 is formed with multiple first orifices 371 in communication with the first flow ways 301. The wall face of the conversion sink 31 of the second portion 352 is formed with multiple second orifices 372 in communication with the second flow guide passage 362. The wall face of the second flow guide passage 362 is formed with multiple third orifices 373 in communication with the second flow ways 302.

The first, second and third orifices 371, 372, 373 are respectively radially formed through the wall face of the first flow guide passage 361, the wall face of the conversion sink 31 of the second portion 352 and the wall face of the second flow guide passage 362. The second and third orifices 372, 373 have a height difference. The second orifices 372 are disposed in a position higher than the position where the third orifices 373 are disposed. Accordingly, after the working fluid 4 flows into the second flow guide passage 362, the working fluid 4 will first collect and then flow to the second flow way 302 through the third orifices 373 disposed in a lower position.

The first plate body 51 has a first face 511 and a second face 512. The second face 512 is correspondingly sealedly mated with one face of the main body 3. The second plate body 52 has a third face 521 and a fourth face 522. The fourth face 522 is correspondingly sealedly mated with the other face of the main body 3. The first and second plate bodies 51, 52 are further formed with a blocking section 523 and an open section 524. The blocking section 523 is formed in a position where the conversion sink 31, the first and second sinks 32, 33 and the first and second flow ways 301, 302 are formed. The open section 524 is formed in a position free from the conversion sink 31, the first and second sinks 32, 33 and the first and second flow ways 301, 302. In other words, the blocking section 523 serves to fully seal the conversion sink 31, the first and second sinks 32, 33 and the first and second flow ways 301, 302, whereby the working fluid 4 inside the water-cooling radiator unit 2 can smoothly flow through the radiator unit 2. In a modified embodiment, the first and second plate bodies 51, 52 are alternatively completely solid plate bodies without any structure (not shown). This can also achieve the same effect as aforesaid.

Two ends of the second plate body 52 are respectively formed with a water inlet 525 and a water outlet 526. The water inlet 525 is disposed in a position where the first sink 32 is formed in communication with the first sink 32. The water outlet 526 is disposed in a position where the second sink 33 is formed in communication with the second sink 33. The number of the water inlet 525 and the water outlet 526 is not limited to one. The number of the water inlet 525 and the water outlet 526 can be adjusted and changed according to the requirement of a user.

The pump 54 is disposed in the conversion sink 31. The pump 54 has multiple blades 541. The pump 54 serves to drive the working fluid 4 to circulate within the main body 3.

Figure 5:
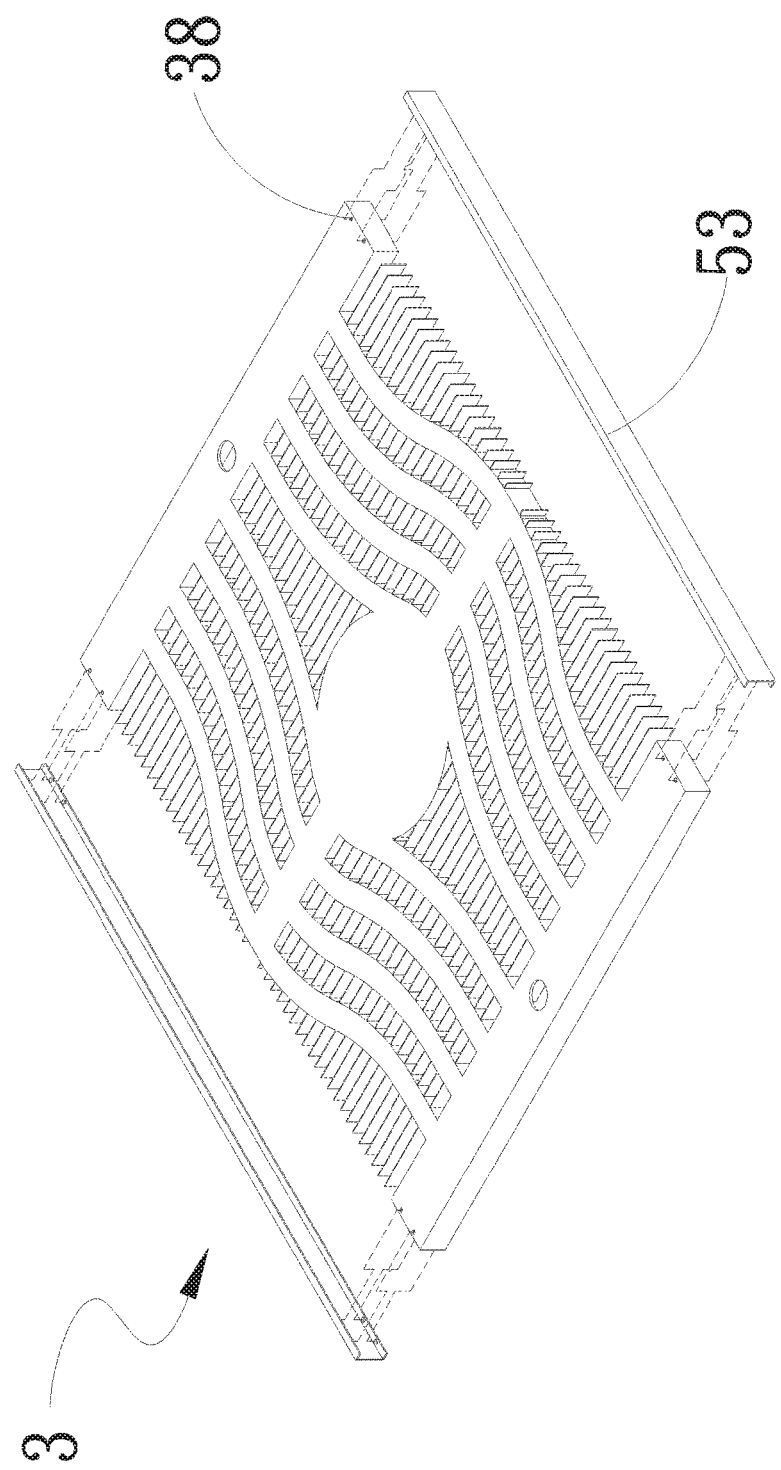
FIG. 5 is a perspective exploded view of a second embodiment of the water-cooling radiator unit of the present invention.

Please now refer to FIG. 5 as well as FIGS. 1 and 2A. FIG. 5 is a perspective exploded view of a second embodiment of the water-cooling radiator unit of the present invention. The second embodiment is partially identical to the first embodiment in component and relationship between the components and thus will not be repeatedly described hereinafter. The second embodiment is mainly different from the first embodiment in that two sides of the first, second and third sheet bodies 21, 22, 23 are further formed with depression sections. The depression sections are stacked on and assembled with each other to form a connection section 38. An assembling section 53 is assembled with the main body 3 in the position of the connection section 38. The assembling section 53 is assembled on the connection section 38 of the main body 3 to increase the strength of the main body 3 and protect the main body 3. (The assembling section 53 can be assembled on the connection section 38 of the main body 3 by means of direct engagement or by means of tightening members for locking the assembling member 53 on the main body 3).

Figure 6:
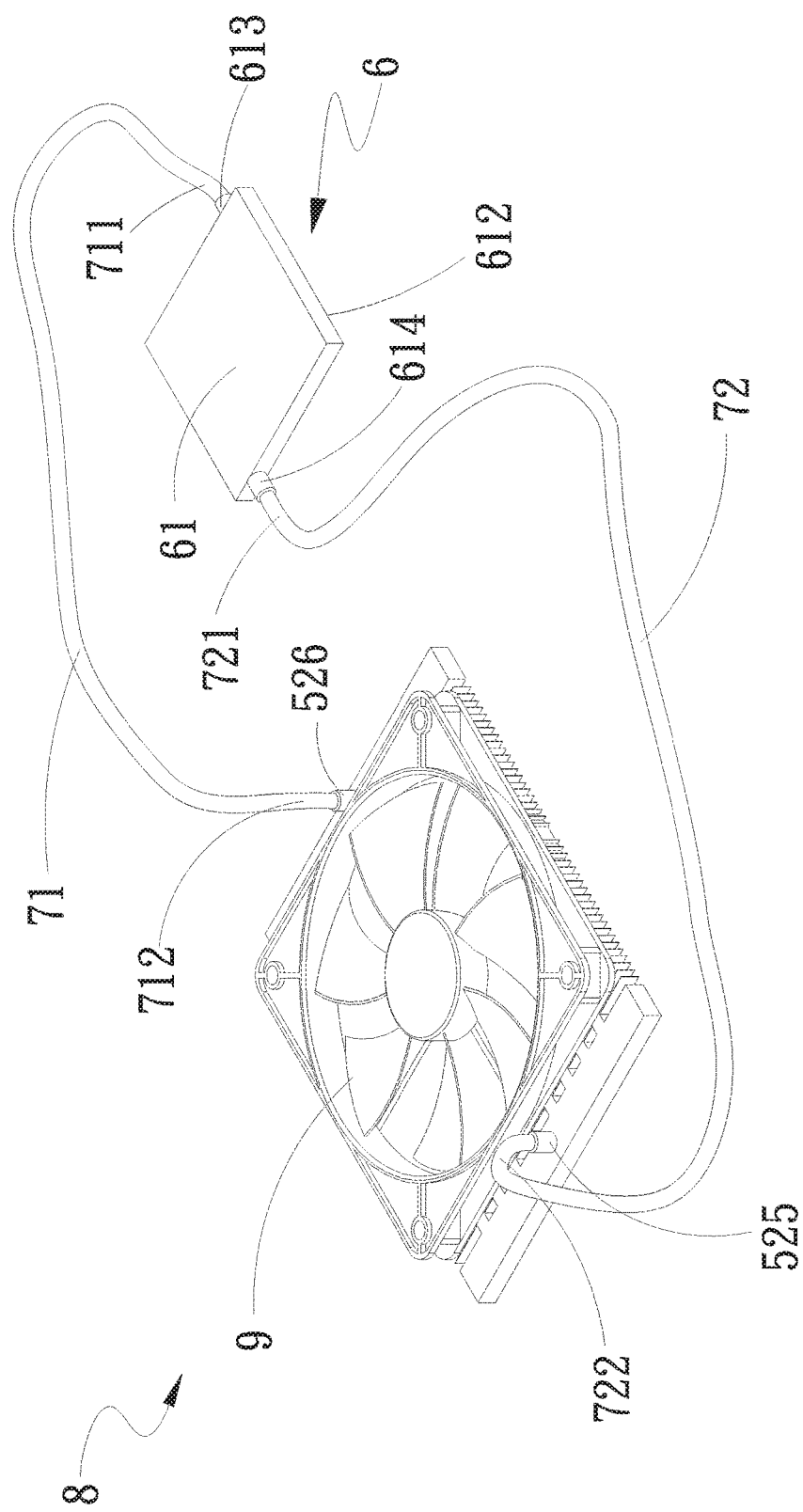
FIG. 6 is a perspective assembled view of a first embodiment of the water-cooling radiator device of the present invention.
Figure 7:
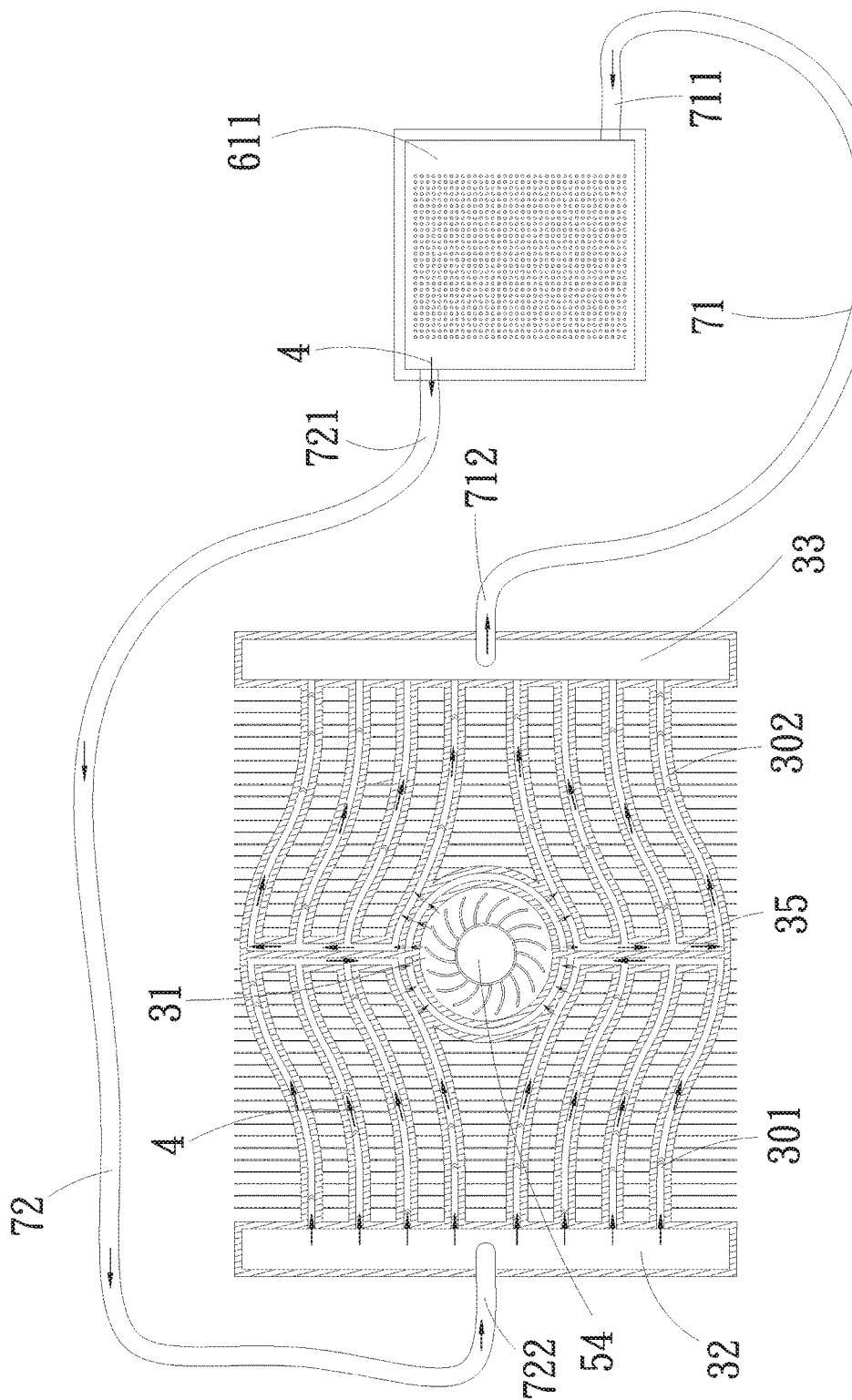
FIG. 7 is a top view of the first embodiment of the water-cooling radiator device of the present invention.
Figure 8:
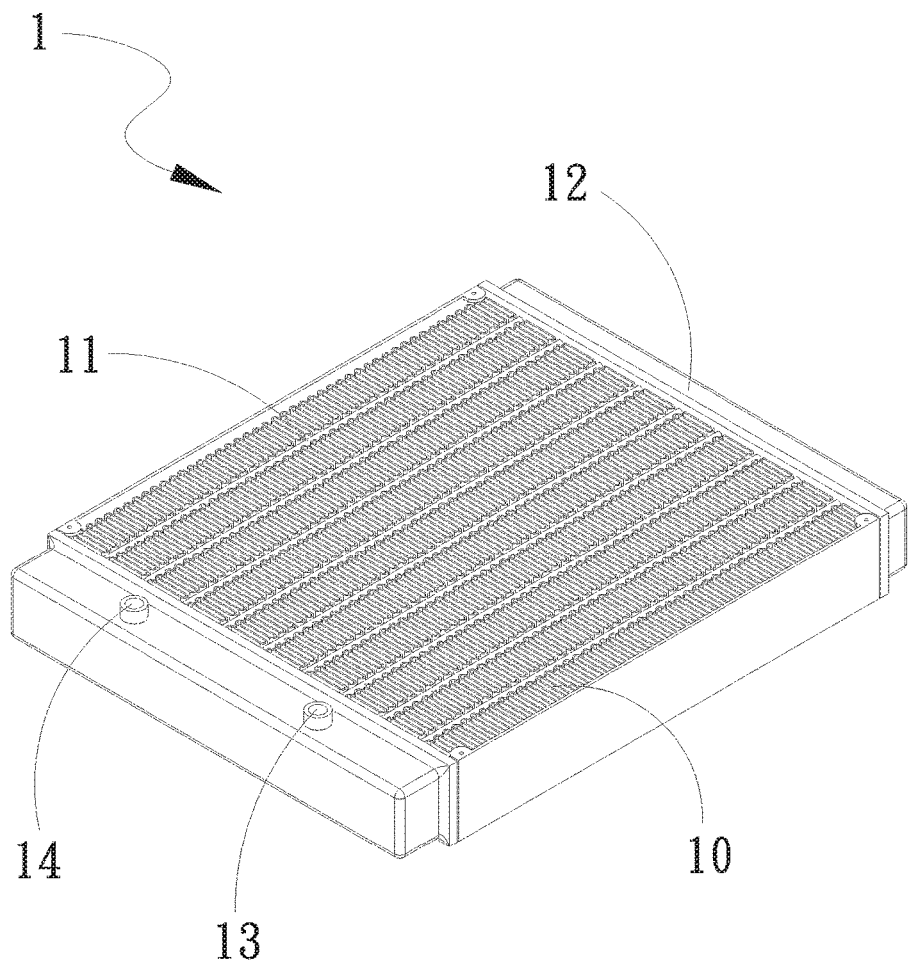
FIG. 8 is a perspective view of a conventional water-cooling radiator device.

Please now refer to FIGS. 6 and 7 as well as FIGS. 2A, 4A and 4B. FIG. 6 is a perspective assembled view of a first embodiment of the water-cooling radiator device of the present invention. FIG. 7 is a top view of the first embodiment of the water-cooling radiator device of the present invention. According to this embodiment, the water-cooling radiator device of the present invention includes a water-cooling radiator unit 2, a water-cooling component 6, a first tube body 71 and a second tube body 72. The water-cooling radiator unit 2 is identical to the aforesaid water-cooling radiator unit 2 in component and relationship between the components and thus will not be repeatedly described hereinafter. The water-cooling component 6 has a case 61. The case 61 has at least one water receptacle 611, a heat exchange interface 612, a water inlet 613 and a water outlet 614. The heat exchange interface 612 is disposed on one side of the case 61. The water inlet 613 and water outlet 614 communicate with the water receptacle 611. The first tube body 71 has a first end 711 and a second end 712. The first end 711 is connected to the water inlet 613 of the water-cooling component 6. The second end 712 is connected to the water outlet 526 of the second plate body 52. The second tube body 72 has a third end 721 and a fourth end 722. The third end 721 is connected to the water outlet 614 of the water-cooling component 6. The fourth end 722 is connected to the water inlet 525 of the second plate body 52.

According to the structural design of the water-cooling radiator device 8, the heat exchange interface 612 of the water-cooling component 6 is in contact with an electronic device (not shown). A fan 9 is mounted on one side of the water-cooling radiator unit 2 of the water-cooling radiator device 8. In operation, the heat exchange interface 612 of the water-cooling component 6 first absorbs the heat generated by the electronic device. The working fluid 4 in the water receptacle 611 flows from the water outlet 614 of the water-cooling component 6 through the second tube body 72 into the water-cooling radiator unit 2. The working fluid 4 then flows from the water inlet 525 of the second plate body 52 of the water-cooling radiator unit 2 into the first sink 32 and the first flow ways 301 of the main body 3. Then, the working fluid 4 flows through the first orifices 371 into the first flow guide passage 361 and then collectively flows into the water receiving chamber 363. Thereafter, the working fluid 4 flows through the perforation 221 to the conversion sink 31. At this time, the pump 54 in the conversion sink 31 will drive the working fluid 4 through the second orifices 372 to the second flow guide passage 362. Then, the working fluid 4 is guided to flow through the third orifices 373 to the second flow ways 302. Then the working fluid 4 flows to the second sink 33. At this stage, the temperature of the working fluid 4 is lowered by means of the fan 9. After the temperature is lowered, the working fluid 4 will flow through the water outlet 526 of the second plate body 52 into the first tube body 71. Finally, the working fluid 4 will flow through the first tube body 71 into the water inlet 613 of the water-cooling component 6 to complete the heat exchange circulation. In the conventional device, the radiating fins and the water flow passages and the relevant components must be connected by means of soldering to form the heat dissipation device. This will lead to the problem of thermal impedance. The water-cooling radiator device 8 of the present invention eliminates the shortcoming of the conventional heat dissipation device and greatly enhances the heat exchange efficiency. In addition, it is time-consuming to manufacture the conventional heat dissipation device and the manufacturing cost of the conventional heat dissipation device is very high. The water-cooling radiator device 8 of the present invention also eliminates these shortcomings of the conventional heat dissipation device.

In a modified embodiment, a nozzle (not shown) can be disposed on the perforation 221 in communication with the water receiving chamber 363 and the conversion sink 31. Accordingly, when the working fluid 4 flows from the water receiving chamber 363 to the conversion sink 31, a water flow impact is created.

In a preferred embodiment, the shaft (not shown) of the fan 9 is passed through the second plate body 52 and connected with the pump 54 of the water-cooling radiator unit 2. In other words, in this embodiment, only one motor is needed to drive the fan 9 and the water-cooling radiator unit 2 at the same time. In this case, the entire water-cooling radiator device 8 can be smoothly operated to complete the heat exchange circulation.

According to the above, in comparison with the conventional device, the present invention has the following advantages:
1. The present invention improves the problem of thermal impedance of the conventional heat dissipation device.
2. The manufacturing cost of the present invention is lower and the manufacturing time of the present invention is shortened.
3. The heat exchange efficiency of the present invention is greatly enhanced.
4. The present invention has the characteristic of diversified and flexible design.

The present invention has been described with the above embodiments thereof and it is understood that many changes and modifications of the above embodiments can be carried out without departing from the scope and the spirit of the invention that is intended to be limited only by the appended claims.

What is claimed is:

1. A water-cooling radiator unit comprising:
a main body composed of a first sheet body, a second sheet body and a third sheet body stacked on and assembled with each other, each of the first, second and third sheet bodies being composed of multiple thin sheets laminated with each other, each of the first, second and third sheet bodies having multiple first strip-shaped flow guide sections, multiple second strip-shaped flow guide sections and a circular conversion section, the first strip-shaped flow guide sections longitudinally extending and being arranged about the circular conversion section, the second strip-shaped flow guide sections transversely extending and being disposed on two sides of the circular conversion section, two ends of each of the first, second and third sheet bodies respectively having a first slot and a second slot, the aforesaid structures of the first, second and third sheet bodies being correspondingly stacked on and assembled with each other to form a flow way set, a conversion sink, a first sink and a second sink, the flow way set having multiple first flow ways and multiple second flow ways arranged at intervals, each first flow way and each second flow way defining therebetween a radiating fin section, the second strip-shaped flow guide sections together defining a partitioning section, the partitioning section and the conversion sink together dividing the main body into a first portion and a second portion, a first bight flow guide section being formed on outer side of the circular conversion section of each of the first and second sheet bodies, the first bight flow guide sections being correspondingly stacked on and assembled with each other to form a first flow guide passage, the first flow guide passage, the first flow ways and the first sink being disposed on the first portion in communication with each other, a second bight flow guide section being formed on outer side of the circular conversion section of each of the first, second and third sheet bodies, the second bight flow guide sections being correspondingly stacked on and assembled with each other to form a second flow guide passage, the second flow guide passage, the second flow ways and the second sink being disposed on the second portion in communication with each other, the second sheet body being formed with a circular diaphragm at the circular conversion section, the diaphragm having a perforation, the diaphragm and the third sheet body together defining a water receiving chamber, a wall face of the first flow guide passage being formed with multiple first orifices in communication with the first flow ways, a wall face of the conversion sink of the second portion being formed with multiple second orifices in communication with the second flow guide passage, a wall face of the second flow guide passage being formed with multiple third orifices in communication with the second flow ways;
a working fluid filled in the main body;
a first plate body attached to one face of the main body;
a second plate body attached to the other face of the main body; and
a pump inserted on the first plate body and received in the conversion sink, the pump having multiple blades, the pump serving to drive the working fluid to circulate within the main body.

2. The water-cooling radiator unit as claimed in claim 1, wherein the first, second and third sheet bodies further has multiple connection sections, the connection sections being transversely bridged over the first and second flow ways, two ends of the connection sections being connected with the radiating fin sections.

3. The water-cooling radiator unit as claimed in claim 1, wherein the first plate body has a first face and a second face, the second face being correspondingly sealedly mated with one face of the main body, the second plate body having a third face and a fourth face, the fourth face being correspondingly sealedly mated with the other face of the main body.

4. The water-cooling radiator unit as claimed in claim 3, wherein two ends of the second plate body are respectively formed with a water inlet and a water outlet, the water inlet being disposed in a position where the first sink is formed in communication with the first sink, the water outlet being disposed in a position where the second sink is formed in communication with the second sink.

5. The water-cooling radiator unit as claimed in claim 1, wherein the first, second and third sheet bodies are made of a material selected from a group consisting of aluminum, copper, iron, titanium and stainless steel or any other suitable metal material.

6. The water-cooling radiator unit as claimed in claim 1, wherein two sides of the first, second and third sheet bodies are further formed with depression sections, the depression sections being stacked on and assembled with each other to form a connection section, an assembling section being assembled with the main body in the position of the connection section.

7. The water-cooling radiator unit as claimed in claim 1, wherein the first and second plate bodies are further formed with a blocking section and an open section, the blocking section being formed in a position where the conversion sink, the first and second sinks and the first and second flow ways are formed, the open section being formed in a position free from the conversion sink, the first and second sinks and the first and second flow ways.

8. The water-cooling radiator unit as claimed in claim 1, wherein the first and second flow ways are straight or curved.

9. The water-cooling radiator unit as claimed in claim 1, wherein the second and third orifices have a height difference, the second orifices being disposed in a position higher than a position where the third orifices are disposed.

10. A water-cooling radiator device comprising:
a water-cooling radiator unit including:
a main body composed of a first sheet body, a second sheet body and a third sheet body stacked on and assembled with each other, each of the first, second and third sheet bodies being composed of multiple thin sheets laminated with each other, each of the first, second and third sheet bodies having multiple first strip-shaped flow guide sections, multiple second strip-shaped flow guide sections and a circular conversion section, the first strip-shaped flow guide sections longitudinally extending and being arranged about the circular conversion section, the second strip-shaped flow guide sections transversely extending and being disposed on two sides of the circular conversion section, two ends of each of the first, second and third sheet bodies respectively having a first slot and a second slot, the aforesaid structures of the first, second and third sheet bodies being correspondingly stacked on and assembled with each other to form a flow way set, a conversion sink, a first sink and a second sink, the flow way set having multiple first flow ways and multiple second flow ways arranged at intervals, each first flow way and each second flow way defining therebetween a radiating fin section, the second strip-shaped flow guide sections together defining a partitioning section, the partitioning section and the conversion sink together dividing the main body into a first portion and a second portion, a first bight flow guide section being formed on outer side of the circular conversion section of each of the first and second sheet bodies, the first bight flow guide sections being correspondingly stacked on and assembled with each other to form a first flow guide passage, the first flow guide passage, the first flow ways and the first sink being disposed on the first portion in communication with each other, a second bight flow guide section being formed on outer side of the circular conversion section of each of the first, second and third sheet bodies, the second bight flow guide sections being correspondingly stacked on and assembled with each other to form a second flow guide passage, the second flow guide passage, the second flow ways and the second sink being disposed on the second portion in communication with each other, the second sheet body being formed with a circular diaphragm at the circular conversion section, the diaphragm having a perforation, the diaphragm and the third sheet body together defining a water receiving chamber, a wall face of the first flow guide passage being formed with multiple first orifices in communication with the first flow ways, a wall face of the conversion sink of the second portion being formed with multiple second orifices in communication with the second flow guide passage, a wall face of the second flow guide passage being formed with multiple third orifices in communication with the second flow ways;

a working fluid filled in the main body;
a first plate body attached to one face of the main body;
a second plate body attached to the other face of the main body; and
a pump inserted on the first plate body and received in the conversion sink, the pump having multiple blades, the pump serving to drive the working fluid to circulate within the main body;
a water-cooling component having a case, the case having at least one water receptacle, a heat exchange interface, a water inlet and a water outlet, the heat exchange interface being disposed on one side of the case, the water inlet and water outlet communicating with the water receptacle;
a first tube body having a first end and a second end, the first end being connected to the water inlet of the water-cooling component, the second end being connected to the second sink; and
a second tube body having a third end and a fourth end, the third end being connected to the water outlet of the water-cooling component, the fourth end being connected to the first sink.

11. The water-cooling radiator device as claimed in claim 10, wherein a nozzle is disposed on the perforation in communication with the water receiving chamber and the conversion sink.

12. The water-cooling radiator device as claimed in claim 10, further comprising a fan mounted on one side of the water-cooling radiator unit, a shaft of the fan being connected with the pump.

* * * * *